(12) United States Patent
Gao et al.

(10) Patent No.: US 11,690,272 B2
(45) Date of Patent: Jun. 27, 2023

(54) DISPLAY PANEL AND DISPLAY DEVICE

(71) Applicant: BOE TECHNOLOGY GROUP CO., LTD., Beijing (CN)

(72) Inventors: Hao Gao, Beijing (CN); Zhihui Zhang, Beijing (CN); Xu Li, Beijing (CN); Xing Fan, Beijing (CN); Penghao Gu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/539,095

(22) Filed: Nov. 30, 2021

(65) Prior Publication Data
US 2022/0293698 A1 Sep. 15, 2022

(30) Foreign Application Priority Data
Mar. 10, 2021 (CN) .......................... 202110260976.2

(51) Int. Cl.
*H10K 59/50* (2023.01)
*G02F 1/01* (2006.01)
(Continued)

(52) U.S. Cl.
CPC .......... *H10K 59/50* (2023.02); *G02F 1/0136* (2013.01); *G02F 1/137* (2013.01);
(Continued)

(58) Field of Classification Search
None
See application file for complete search history.

(56) References Cited

U.S. PATENT DOCUMENTS 9,846,473 B1* 12/2017 Kalscheur ............. G01J 5/0025
2004/0125430 A1* 7/2004 Kasajima .......... G02F 1/133536
359/247
(Continued)

FOREIGN PATENT DOCUMENTS

CN 104391406 A 3/2015
CN 106200148 A 12/2016
(Continued)

OTHER PUBLICATIONS

China Patent Office, CN202110260976.2 First Office Action dated Aug. 3, 2022.

*Primary Examiner* — Ryan Crockett
(74) *Attorney, Agent, or Firm* — Houtteman Law LLC

(57) ABSTRACT

Embodiments of the disclosure provide a display panel and a display device. The display panel includes a substrate, a plurality of light emitting elements and at least one transmissive-reflective module, where the light emitting elements are arranged on the substrate; each of the light emitting elements includes a first electrode, a light emitting functional layer and a second electrode arranged along a direction vertical to the substrate and away from the substrate; the at least one transmissive-reflective module is arranged on a side, close to the substrate, of the first electrode of at least one of the light emitting elements, and/or on a side, away from the substrate, of the second electrode of at least one of the light emitting elements; the transmissive-reflective module is configured to switch between a transmissive state and a reflective state.

15 Claims, 9 Drawing Sheets

(51) Int. Cl.
*G02F 1/1335* (2006.01)
*G02F 1/1343* (2006.01)
*G02F 1/137* (2006.01)

(52) U.S. Cl.
CPC .. *G02F 1/133528* (2013.01); *G02F 1/133553* (2013.01); *G02F 1/134309* (2013.01); *G02F 2201/44* (2013.01); *G02F 2203/09* (2013.01)

(56) References Cited

U.S. PATENT DOCUMENTS

| | | | |
|---|---|---|---|
| 2012/0105400 A1* | 5/2012 | Mathew | G06F 1/1626 345/207 |
| 2012/0258773 A1* | 10/2012 | Alvarez Rivera | G06F 1/1656 726/19 |
| 2012/0268696 A1* | 10/2012 | Yim | G02F 1/157 349/104 |
| 2015/0014650 A1* | 1/2015 | Lim | H01L 51/5281 257/40 |
| 2016/0048058 A1* | 2/2016 | Xu | G02F 1/1336 349/61 |
| 2017/0124942 A1* | 5/2017 | Evans, V | G02B 27/0093 |
| 2020/0124912 A1* | 4/2020 | Qin | G02F 1/133514 |
| 2020/0286436 A1* | 9/2020 | Lim | G01J 1/02 |
| 2021/0339680 A1* | 11/2021 | Lundy | G02F 1/13756 |
| 2022/0293698 A1* | 9/2022 | Gao | G02F 1/137 |

FOREIGN PATENT DOCUMENTS

| | | |
|---|---|---|
| CN | 108681143 A | 10/2018 |
| CN | 109119456 A | 1/2019 |
| CN | 109994535 A | 7/2019 |

* cited by examiner

DISPLAY PANEL AND DISPLAY DEVICE

CROSS-REFERENCE TO RELATED APPLICATIONS

The present application claims the priority of Chinese Patent Application No. 202110260976.2, filed on Mar. 10, 2021, the contents of which are incorporated herein in their entirety by reference.

TECHNICAL FIELD

The present disclosure relates to the field of display technology, and in particular, to a display panel and a display device.

BACKGROUND

With a rapid development of display technology, display devices have gradually spread throughout lives of people. Organic electroluminescent display elements (e.g., Organic Light Emitting diodes, OLEDs) are widely used in smart products, such as mobile phones, televisions, notebook computers, etc., due to their advantages of self-luminescence, low power consumption, wide viewing angle, fast response speed, high contrast, and flexible display.

For the organic electroluminescent display device with a full-screen, in order to ensure normal working of an element such as a camera, an infrared sensor or the like, in some related technologies, punching processing is performed in an area of a display panel where the camera or the infrared sensor is disposed; in other related technologies, thinning or local evaporation of a cathode is performed in the area of the display panel where the camera or the infrared sensor is disposed; in further other related technologies, the number of pixels in the area of the display panel where the camera or the infrared sensor is disposed is reduced.

However, the punching processing being performed in the area of the display panel where a functional element such as the camera or the infrared sensor is disposed may cause an area of the display panel that cannot display, which affects integrity of a picture being displayed; the thinning or local evaporation of the cathode or the number of pixels being reduced in the area of the display panel where the camera or the infrared sensor is disposed may cause a picture to be displayed unevenly in the area, and a display effect is affected.

SUMMARY

In an aspect, an embodiment of the present disclosure provides a display panel, which includes a substrate, a plurality of light emitting elements disposed on the substrate, and at least one transmissive-reflective module; each of the light emitting elements includes a first electrode, a light emitting functional layer and a second electrode arranged along a direction perpendicular to the substrate and away from the substrate; the at least one transmissive-reflective module is arranged on a side, close to the substrate, of the first electrode of at least one of the light emitting elements, and/or, on a side, away from the substrate, of the second electrode of the at least one of the light emitting elements; the transmissive-reflective module is configured to switch between a transmissive state and a reflective state.

In some implementations, the display panel has a functional element arrangement area, and a main display area surrounding the functional element arrangement area; the light emitting elements include a first light emitting element arranged in the functional element arrangement area and a second light emitting element arranged in the main display area; the first electrode and the second electrode of the first light emitting element are transmissive electrodes; the first electrode of the second light emitting element is a reflective electrode, and the second electrode of the second light emitting element is a transmissive electrode; the transmissive-reflective module is arranged in the functional element arrangement area and is positioned on a side, close to the substrate, of the first electrode of the first light emitting element.

In some implementations, first electrodes and second electrodes of the light emitting elements are all transmissive electrodes; the transmissive-reflective module is disposed on a side, close to the substrate, of the first electrodes of the light emitting elements.

In some implementations, the display panel further includes a specular reflection layer disposed on a side, close to the substrate, of the transmissive-reflective module.

In some implementations, first electrodes and second electrodes of the light emitting elements are all transmissive electrodes; the display panel includes two transmissive-reflective modules, one transmissive-reflective module is arranged on a side, close to the substrate, of the first electrodes of the light emitting elements, and the other transmissive-reflective module is arranged on a side, away from the substrate, of the second electrodes of the light emitting elements.

In some implementations, first electrodes of the light emitting elements are all reflective electrodes and second electrodes of the light emitting elements are all transmissive electrodes; the transmissive-reflective module is arranged on a side, away from the substrate, of the second electrodes of the light emitting elements.

In some implementations, the transmissive-reflective module includes a polarizer, a liquid crystal cell and a distributed Bragg reflective film layer, the liquid crystal cell is arranged on a side, away from the light emitting elements, of the polarizer, and is configured to enable a polarization direction of polarized light passing through the liquid crystal cell to be unchanged or deflected by 90 degrees; the distributed Bragg reflective film layer is arranged on a side, away from the light emitting elements, of the liquid crystal cell, and the distributed Bragg reflective film layer has a relatively high reflection characteristic on light with a polarization direction perpendicular to an absorption axis of the polarizer; the distributed Bragg reflective film layer has a relatively high transmission characteristic on light with a polarization direction parallel to the absorption axis of the polarizer.

In some implementations, the distributed Bragg reflective film layer includes a plurality of first dielectric layers and a plurality of second dielectric layers, the plurality of first dielectric layers and the plurality of second dielectric layers are alternately stacked, and for polarized light with a polarization direction perpendicular to an absorption axis of the polarizer, a difference between a refractive index of each of the first dielectric layers and a refractive index of each of the second dielectric layers is greater than or equal to about 0.3; for polarized light with a polarization direction parallel to the absorption axis of the polarizer, the difference between the refractive index of each of the first dielectric layer and the refractive index of each of the second dielectric layers is less than or equal to about 0.2.

In some implementations, the liquid crystal cell includes a liquid crystal layer, and a third electrode layer and a fourth electrode layer disposed on opposite sides of the liquid crystal layer; a direction of long axis of liquid crystal molecules in the liquid crystal layer is substantially perpendicular to a surface of the third electrode layer, the liquid crystal cell is configured such that a polarization direction of polarized light passing through the liquid crystal layer is not changed when no electric field is generated between the third electrode layer and the fourth electrode layer; and when an electric field is generated between the third electrode layer and the fourth electrode layer, the liquid crystal molecules in the liquid crystal layer are deflected, and the polarization direction of polarized light passing through the liquid crystal layer is deflected by 90 degrees.

In some implementations, the transmissive-reflective module is disposed on a side, close to the substrate, of the first electrode of at least one of the light emitting elements; the display panel further includes a pixel driving circuit, and the pixel driving circuit is arranged between the transmissive-reflective module and the substrate.

In some implementations, the transmissive-reflective module is disposed on a side, away from the substrate, of the second electrode of at least one of the light emitting elements, the display panel further includes an encapsulation layer, and the encapsulation layer is arranged on a side, away from the substrate, of the transmissive-reflective module.

In some implementations, the transmissive-reflective module is disposed on a side, away from the substrate, of the second electrode of at least one of the light emitting elements, and the display panel further includes a circular polarizer disposed on a side, away from the substrate, of the transmissive-reflective module.

In another aspect, an embodiment of the present disclosure provides a display device, which includes the display panel described above.

In some implementations, the display panel has a functional element arrangement area, and a main display area surrounding the functional element arrangement area; the light emitting elements of the display panel include a first light emitting element arranged in the functional element arrangement area and a second light emitting element arranged in the main display area; the first electrode and the second electrode of the first light emitting element are transmissive electrodes; the first electrode of the second light emitting element is a reflective electrode, and the second electrode is a transmissive electrode, the transmissive-reflective module of the display panel is arranged in the functional element arrangement area and is positioned on a side, close to the substrate, of the first electrode of the first light emitting element, and the display device further includes a functional element which is arranged in the functional element arrangement area and is arranged on a non-display side of the display panel.

In some implementations, first electrodes and second electrodes of the light emitting elements of the display panel are all transmissive electrodes, the transmissive-reflective module of the display panel is disposed on a side, close to the substrate, of the first electrodes of the light emitting elements, the display device further includes a reflective mirror disposed on a non-display side of the display panel, and a mirror surface of the reflective mirror faces the display panel.

DESCRIPTION OF DRAWINGS

In order to more clearly illustrate technical solutions of the present disclosure, drawings required to be used in embodiments of the present disclosure will be briefly described below, and it is apparent that the drawings in the following description are only some drawings of the embodiments of the present disclosure, and other drawings can be obtained by those skilled in the art according to the drawings. Furthermore, the drawings in the following description may be considered as schematic diagrams, and do not limit actual sizes of products, actual flows of methods, actual timings of signals, and the like, involved in the embodiments of the present disclosure.

DESCRIPTION OF EMBODIMENTS

Figure 1:
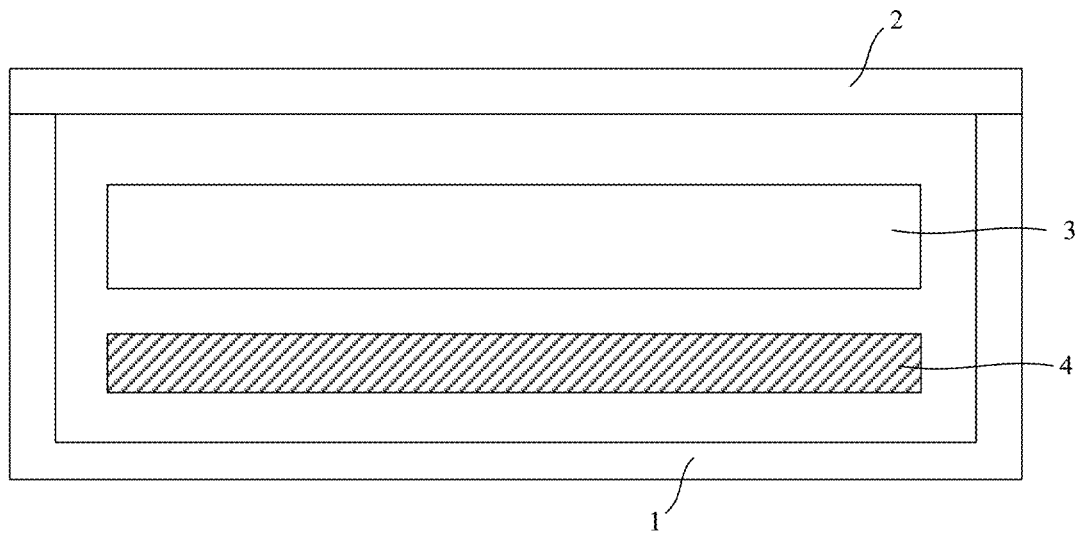
FIG. 1 is a basic structural diagram of a display device according to an embodiment of the present disclosure.

The technical solutions in the embodiments of the present disclosure will be more clearly and completely described below with reference to the accompanying drawings, and it is to be understood that the described embodiments are only a part of the embodiments of the present disclosure, and not all of the embodiments. All other embodiments obtained by a person of ordinary skill in the art based on the embodiments provided in the present disclosure are within the scope of protection of the present disclosure.

Unless the context requires, otherwise, throughout the specification and claims, the term "comprise/include" and its other forms (e.g. "comprises/includes" and "comprising/including") are to be interpreted as open-ended meaning, i.e., "including, but not limited to"). In the description of the specification, the terms "an embodiment", "some embodiments", "exemplary embodiments", "example", "specific example" or "some examples" and the like are intended to indicate that a particular feature, structure, material, or characteristic associated with the embodiment or example is included in at least one embodiment or example of the present disclosure. The schematic representations of the terms used above are not necessarily referring to the same embodiment or example. Furthermore, the particular feature, structure, material, or characteristic may be included in any suitable manner in any one or more embodiments or examples.

In the following, the terms "first", "second" are used for descriptive purposes only and are not to be understood as indicating or implying relative importance or implicitly indicating the number of technical features indicated. Thus, a feature defined by "first" or "second" may, explicitly or implicitly, includes one or more corresponding features. In the description of the embodiments of the present disclosure, "plurality" means two or more unless otherwise specified.

For describing some embodiments and implementations, expressions of "connected" and derivatives thereof may be used. For example, the term "connected" may be used in describing some embodiments and implementations to indicate that two or more elements are in direct or indirect physical or electrical contact with each other. The embodiments of the present disclosure are not necessarily limited to the contents herein.

"At least one of A, B and C" has the same meaning as "at least one of A, B or C," both including the following combinations of A, B and C: only A; only B; only C; a combination of A and B; a combination of A and C; a combination of B and C; and a combination of A, B and C.

"A and/or B" includes the following three combinations: only A; only B; and a combination of A and B.

The use of "adapted to" or "configured to" herein is meant to be open and inclusive and does not exclude devices adapted to or configured to perform additional tasks or steps.

In addition, the use of "based on" means open and inclusive in that a process, step, calculation, or any other action that is "based on" one or more conditions or values may, in practice, be further based on additional conditions or additional values.

As used herein, "about," "substantially" or "approximately" includes the particular value set forth and average values within an acceptable range of deviation for that particular value as determined by one of ordinary skill in the art in view of the measurement in question and the error associated with the measurement of the particular value (i.e., limitations of the measurement system).

Example embodiments are described herein with reference to cross-sectional and/or plan views as idealized example figures. In the drawings, thicknesses of layers and areas are exaggerated for clarity. Variations from shapes of illustrations as a result, for example, of manufacturing techniques and/or tolerances, are to be expected. Thus, the example embodiments should not be construed as limited to the shapes of areas illustrated herein but are to include deviations in shapes that result, for example, from manufacturing. For example, an etched area shown as a rectangle will typically have curved features. Thus, the areas illustrated in the figures are schematic in nature and their shapes are not intended to illustrate the actual shape of an area of a device and are not intended to limit the scope of exemplary embodiments.

As shown in FIG. 1, an embodiment of the present disclosure provides a display device 100, and the display device 100 is configured as a visual device or apparatus for displaying electronic information.

For example, the display device 100 may be any product or component with a display function, such as a smart phone, a tablet computer, a television, a display, a notebook computer, and any other wearable electronic device (e.g., a watch).

Here, the display device 100 is an electroluminescent display device or a photoluminescent display device. In a case where the display device 100 is the electroluminescent display device, the electroluminescent display device may be an organic electroluminescent display device (e.g., an OLED display device) or a quantum dot electroluminescent display device (e.g., a QLED (quantum dot light emitting diode) display device). In a case where the display device 100 is the photoluminescent display device, the photoluminescent display device may be a quantum dot photoluminescent display device.

Further, the display device 100 may be a transparent display device or an opaque display device (may be referred to as a single-sided display device) according to whether the user can see a back side of the display device 100. The display device 100 may be a flexible display device or a general display device (may be referred to as a rigid display device) according to whether the display device 100 can be bent or rolled.

As shown in FIG. 1, in some implementations, the display device 100 includes a frame 1, a cover plate 2, a display panel 3, and other electronic components such as a circuit board 4.

The frame 1 may have a U-shaped longitudinal section (a section perpendicular to a display surface of the display device), the cover plate 2 may be disposed on an opening side of the frame 1, the display panel 3, the circuit board 4 and other electronic components may be disposed in a space surrounded by the frame 1 and the cover plate 2, and the circuit board 4 may be disposed on a side, away from the cover plate 2, of the display panel 3.

Figure 2:
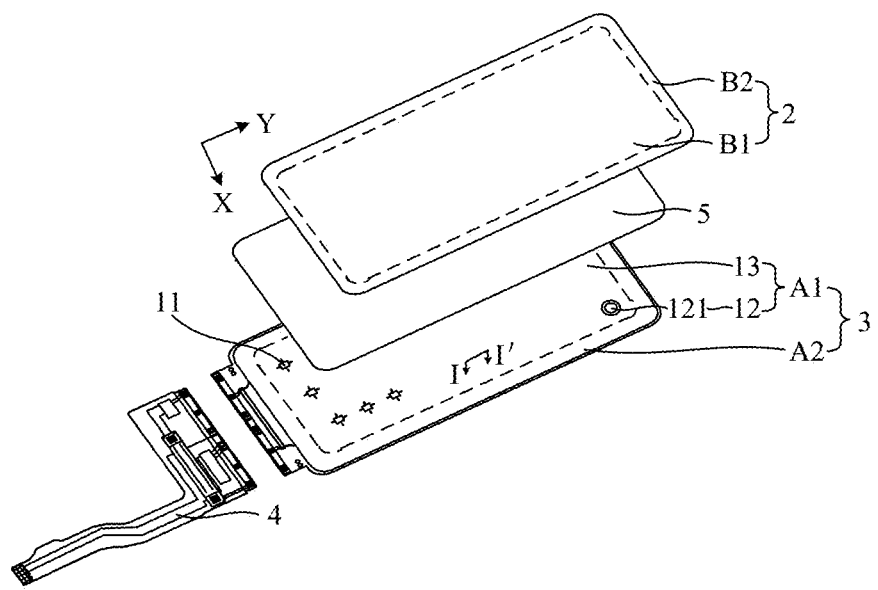
FIG. 2 is an exploded view of a display device according to an embodiment of the present disclosure.

In some implementations, as shown in FIG. 2, the display device 100 may further include a circular polarizer 5 between the cover plate 2 and the display panel 3. The circular polarizer 5 is configured to reduce reflected light of external light after being reflected by metal structures in the display panel 3. The circular polarizer 5 may be attached to the cover plate 2 by an optical adhesive.

In some implementations, as shown in FIG. 2, the display panel 3 has a display area A1 and a peripheral area A2 on at least one side of the display area A1, and FIG. 2 illustrates that the display area A1 is surrounded by the peripheral area A2. The display area A1 is an area for displaying a picture, and the display area A1 is configured to be provided with a plurality of sub-pixels 11 therein; the peripheral area A2 is an area where no picture is to be displayed, and the peripheral area A2 is configured to be provided therein with a display driving circuit such as a gate driving circuit and a source driving circuit.

Based on above, as shown in FIG. 2, the cover plate 2 may include a light-transmitting area B1 and a light-blocking area B2. The light-transmitting area B1 may be at least partially overlapped with the display area A1 of the display panel 3, and light emitted from the display panel 3 can transmit through the light-transmitting area B1 of the cover panel 2 to emit to outside to be seen by human eyes. The light-blocking area B2 may be disposed at a periphery of the light-transmitting area B1, and may be at least partially overlapped with the peripheral area A2 of the display panel 3.

Figure 3A:
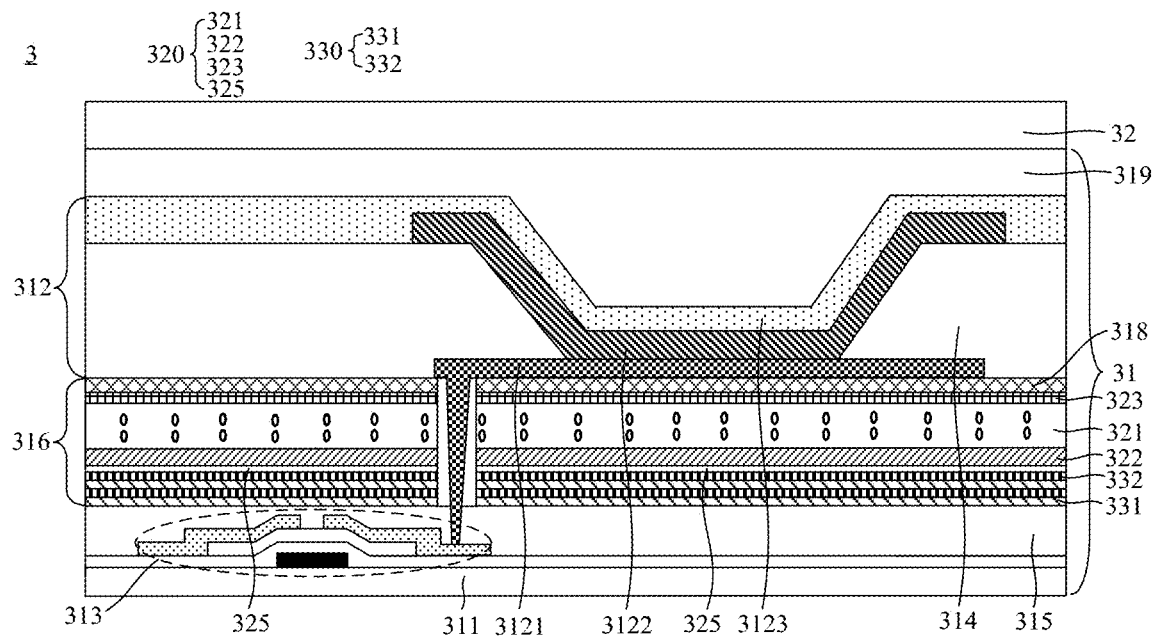
FIG. 3A is a partial cross-sectional view of the display panel shown in FIG. 2 taken along line II'.

As shown in FIG. 3A, the display panel 3 may include a display substrate 31 for displaying and an encapsulation layer 32 for encapsulating the display substrate 31.

Here, the encapsulation layer 32 may be an encapsulation film or an encapsulation substrate.

In some implementations, as shown in FIG. 3A, each of the sub-pixels 11 (see FIG. 2) of the display substrate 31 includes a light emitting element 312 and a pixel driving circuit disposed on a substrate 311, and the pixel driving circuit includes a plurality of thin film transistors 313. Each of the thin film transistors 313 includes an active layer, a source electrode, a drain electrode, a gate electrode, and a gate insulating layer, the source electrode and the drain electrode being in contact with the active layer, respectively. The light emitting element 312 includes a first electrode 3121, a light emitting functional layer 3122, and a second electrode 3123 successively arranged in a direction perpendicular to the substrate 311 and away from the substrate 311.

Here, the first electrode 3121 is an anode of the light emitting element 312, and the second electrode 3123 is a cathode of the light emitting element 312; alternatively, the first electrode 3121 is the cathode of the light emitting element 312 and the second electrode 3123 is the anode of the light emitting element 312. Above situations are all possible, and may be selected according to actual situations.

Illustratively, as shown in FIG. 3A, the first electrode 3121 is the anode of the light emitting element 312, and the second electrode 3123 is the cathode of the light emitting element 312. The first electrode 3121 is electrically connected to the source electrode or the drain electrode of the thin film transistor 313, which serves as a driving transistor, among the plurality of thin film transistors 313.

The display substrate 31 further includes a pixel defining layer 314, the pixel defining layer 314 including a plurality of opening areas, each light emitting element 312 being disposed in one of the opening areas.

In some implementations, the light emitting functional layer 3122 includes only a light emitting layer. In some implementations, the light emitting functional layer 3122 further includes at least one of an electron transport layer (ETL), an electron injection layer (EIL), a hole transport layer (HTL), or a hole injection layer (HIL), in addition to the light emitting layer.

As shown in FIG. 3A, the display substrate 31 further includes a first planarization layer 315 provided between the thin film transistor 313 and the first electrode 3121.

Figure 6A:
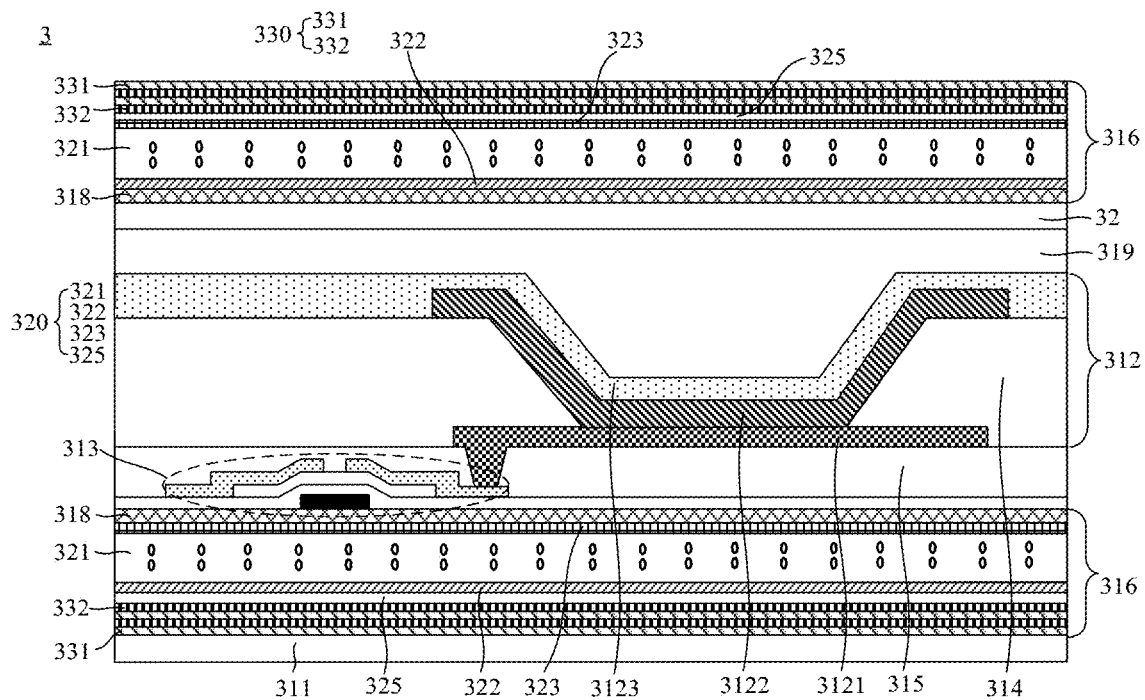
FIG. 6A is a partial cross-sectional view of the display panel shown in FIG. 2 taken along line II'.
Figure 7A:
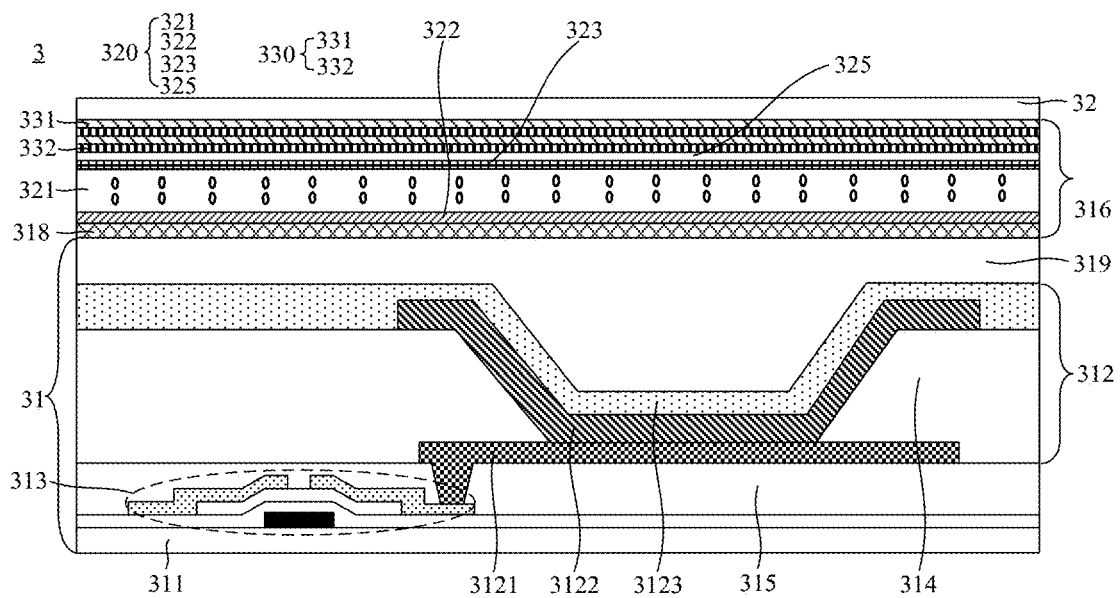
FIG. 7A is a partial cross-sectional view of the display panel shown in FIG. 2 taken along line II'.

As shown in FIG. 3A, FIG. 6A and FIG. 7A, an embodiment of the present disclosure provides a display panel 3, where the display panel 3 further includes at least one transmissive-reflective module 316, and the at least one transmissive-reflective module 316 is disposed on a side, close to the substrate 311, of the first electrode 3121 of at least one of the light emitting elements 312, and/or disposed on a side, away from the substrate 311, of the second electrode 3123 of at least one of the light emitting elements 312. The transmissive-reflective module 316 is configured to switch between a transmissive state and a reflective state.

Here, a transmittance of the transmissive-reflective module 316 in the transmissive state is greater than or equal to about 90%; a reflectance of the transmissive-reflective module 316 in the reflective state is greater than about 80%.

Further, referring to FIG. 2, the display panel 3 may be approximately of a rectangular shape in a plan view. The "rectangular shape" herein includes not only a shape of a standard rectangle but also a shape similar to a rectangle in consideration of process conditions.

Based on above, the display panel 3 has long sides and short sides. In some implementations, the long sides and the short sides of the display panel 3 are at right angles at each intersecting position (i.e., corner) therebetween, so that the display panel 3 is rectangular in shape in the plan view. In some implementations, corners of the display panel 3 are curved, i.e., the corners are smooth, so that the display panel 3 has a rounded rectangle shape in the plan view.

As can be seen from the above description, the display panel 3 provided by the present disclosure includes at least one transmissive-reflective module 316, where the at least one transmissive-reflective module 316 is disposed on a side, close to the substrate 311, of the first electrode 3121 of at least one of the light emitting elements 312, and/or is disposed on a side, away from the substrate 311, of the second electrode 3123 of at least one of the light emitting elements 312. The transmissive-reflective module 316 is configured to switch between the transmissive state and the reflective state.

By switching the transmissive-reflective module 316 between the transmissive state and the reflective state, the transmittance and the reflectance of corresponding side of the display panel 3 can be controlled. Compared with the related art, when the functional element (such as a camera, an infrared sensor, a proximity sensor, an eyeball tracking module, a face recognition module, etc.) of the display panel 3 needs to receive external light, the transmissive-reflective module 316 can be configured to be in the transmissive state in an area of the display panel 3 corresponding to the functional element, and the external light can transmit through the transmissive-reflective module 316 to be received and processed by the functional element; when the functional element of display panel 3 need not receive external light, the transmissive-reflective module 3 can be configured to be in the reflective state, and display panel 3 normally displays, thereby a relatively poor display effect of the display panel, with a full screen, in an area where the camera, the infrared sensor or the like is provided in the related art is improved.

Figure 3B:
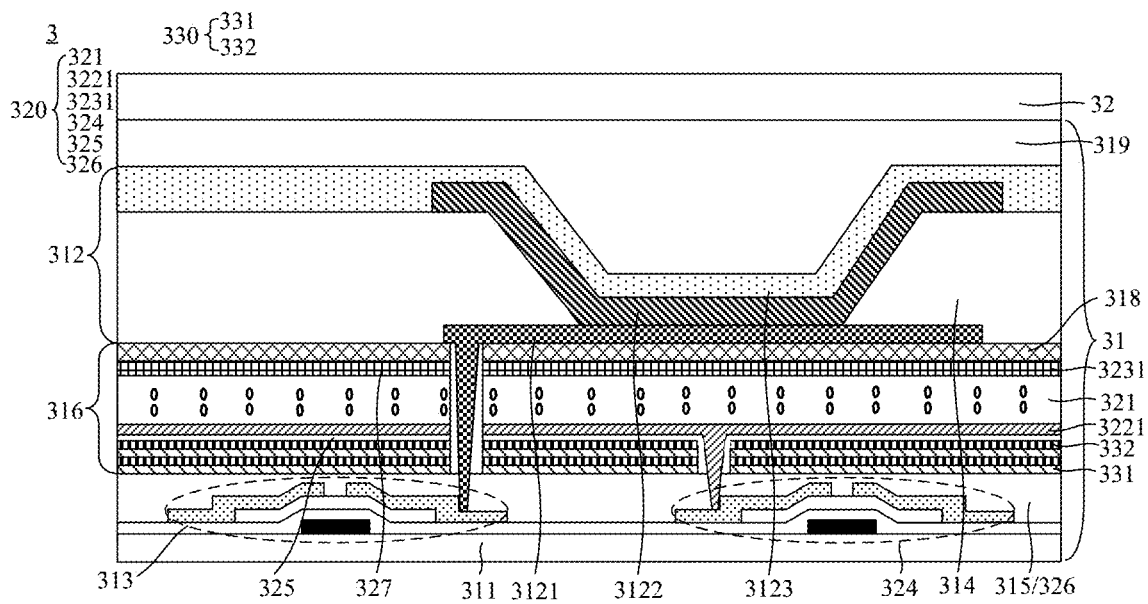
FIG. 3B is a partial cross-sectional view of the display panel shown in FIG. 2 along line II'.

In some implementations, referring to FIGS. 2, 3A and 3B, the display panel 3 may have a functional element arrangement area 12 and a main display area 13 surrounding the functional element arrangement area 12, and the light emitting elements 312 include a first light emitting element disposed in the functional element arrangement area 12 and a second light emitting element disposed in the main display area 13. The first electrode 3121 and the second electrode 3123 of the first light emitting element are transmissive electrodes; the first electrode 3121 of the second light emitting element is a reflective electrode, and the second electrode 3123 of the second light emitting element is a transmissive electrode.

In such case, the transmissive-reflective module 316 is disposed in the functional element arrangement area 12 and on a side, close to the substrate 311, of the first electrode 3121 of the first light emitting element. When the display panel 3 normally displays a picture, the transmissive-reflective module 316 in the functional element arrangement area 12 is configured to be in the reflective state, and light emitted from the light emitting functional layer 3122 can be reflected by the transmissive-reflective module 316 and can transmit through the second electrode 3123, so as to ensure integrity and uniformity of the picture displayed and achieve a better display effect. When the functional element 60 (see FIG. 12) operates, the transmissive-reflective module 316 in the functional element arrangement area 12 is configured to be in the transmissive state, and external light can transmit through the transmissive-reflective module 316; that is, external light can transmit through the functional element arrangement area 12 of the display panel 3 to be received and processed by the functional element 60, ensuring normal operation of the functional element 60.

Here, the reflective electrode is an opaque electrode, and the transmissive electrode is a transparent or translucent electrode. The reflectance of the reflective electrode is greater than that of the transmissive electrode, and the reflectance of the reflective electrode is greater than or equal to about 50%; the transmittance of the transmissive electrode is greater than that of the reflective electrode, and the transmittance of the transmissive electrode is greater than or equal to about 50%. It is understood that the higher the reflectance of the reflective electrode is, and the higher the transmittance of the transmissive electrode is, the better the display effect of the display panel 3 is.

In addition, the functional element arrangement area 12 may be provided with at least one functional element therein, and the functional element may be a camera, an infrared sensor, a proximity sensor, an eyeball tracking module, a face recognition module, or the like. Illustratively, as shown in FIG. 2, the functional element arrangement area 12 is a camera arrangement area 121 for disposing a camera therein.

In some implementations, referring to FIGS. 3A and 3B, first electrodes 3121 and second electrodes 3123 of the light emitting elements 312 in the display panel 3 are all transmissive electrodes.

In such case, the transmissive-reflective module 316 is disposed on a side, close to the substrate 311, of the first electrodes 3121 of the light emitting elements 312. When the transmissive-reflective module 316 is in the transmissive state, the display panel 3 can implement transparent displaying; when the transmissive-reflective module 316 is in the reflective state, the display panel 3 displays on a single side thereof, and has a relatively good display effect. That is, the transmissive-reflective module 316 is switched between the transmissive state and the reflective state, so that the display panel 3 can be switched between a transparent display mode and a single-sided display mode. Therefore, a user can control the display panel 3 to perform transparent displaying or single-sided displaying according to personal requirements, has a relatively high degree of freedom for controlling, and user's experiences are improved.

Figure 5A:
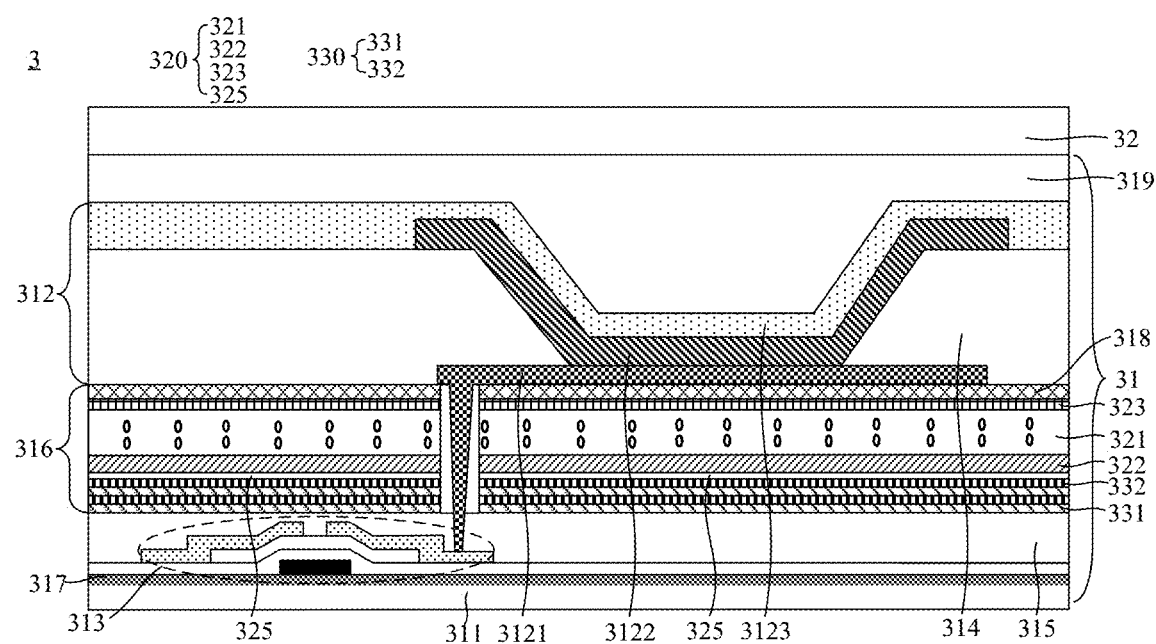
FIG. 5A is a partial cross-sectional view of the display panel shown in FIG. 2 taken along line II'.
Figure 5B:
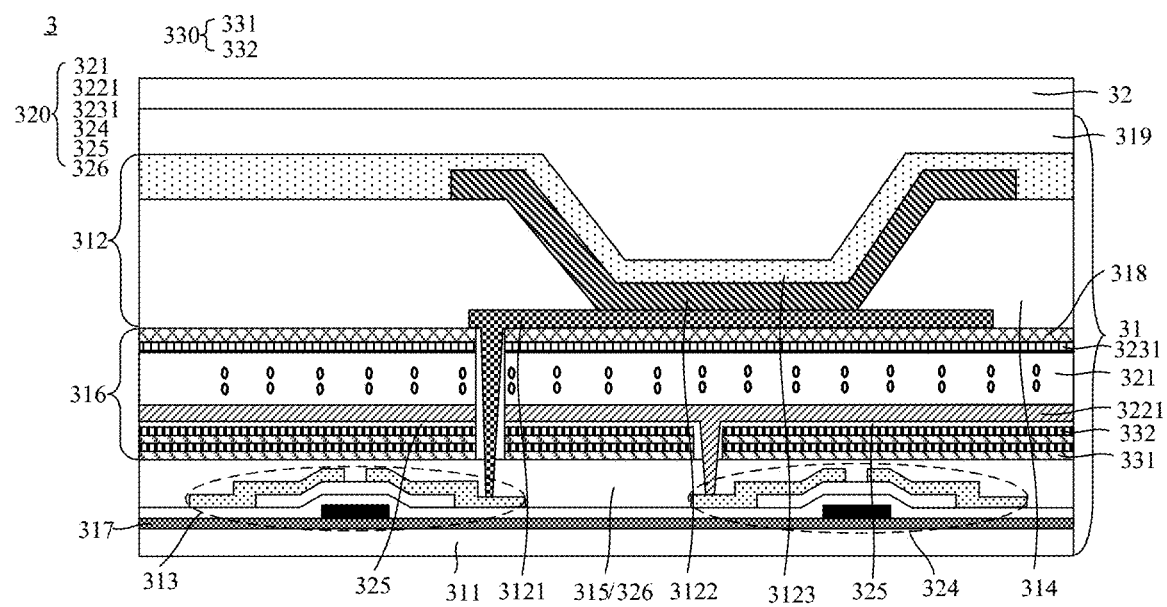
FIG. 5B is a partial cross-sectional view of the display panel shown in FIG. 2 taken along line II'.

In some implementations, as shown in FIGS. 5A and 5B, the display panel 3 may further include a specular reflection layer 317, and the first electrode 3121 and the second electrode 3123 of each of the light emitting elements 312 in the display panel 3 are both transmissive electrodes. Here, a boundary of the specular reflection layer 317 approximately coincides with a boundary of the display area A1 (see FIG. 2).

In such case, the transmissive-reflective module 316 is disposed on a side, close to the substrate 311, of the first electrodes 3121 of the light emitting elements 312, and the specular reflection layer 317 is disposed on a side, close to the substrate 311, of the transmissive-reflective module 316. When the display panel 3 normally displays a picture, the transmissive-reflective module 316 is configured to be in the reflective state, and light emitted from the light emitting functional layer 3122 can be reflected by the transmissive-reflective module 316 and can transmit through the second electrode 3123, so as to ensure a relatively strong microcavity effect and a relatively good display effect. When the display panel 3 is in a mirror display mode (not used for displaying a picture), the transmissive-reflective module 316 is configured to be in the transmissive state, so that external light can transmit through the transmissive-reflective module 316 and reflected by the specular reflection layer 317 to present a mirror image, thereby providing a relatively good mirror display effect.

Here, the reflectance of the specular reflective layer 317 is greater than or equal to about 95%; for example, the reflectance of the specular reflective layer 317 is about 99%.

In addition, the material of the specular reflection layer 317 is not limited. Illustratively, the specular reflective layer 317 may be a metal layer with a relatively high reflectance, for example, the specular reflective layer 317 may be a silver layer.

Figure 6B:
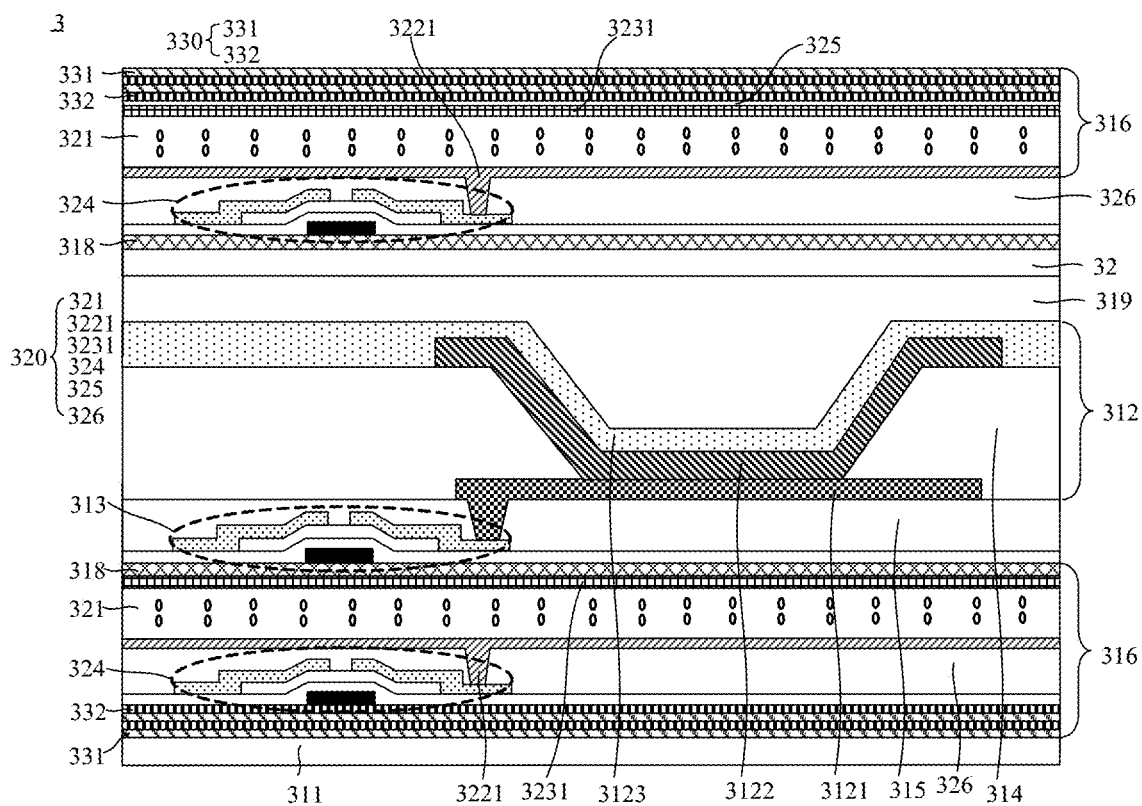
FIG. 6B is a partial cross-sectional view of the display panel shown in FIG. 2 taken along line II'.

In some implementations, as shown in FIGS. 6A and 6B, the display panel 3 may include two transmissive-reflective modules 316, and the first electrodes 3121 and the second electrodes 3123 of the light emitting elements 312 in the display panel 3 are all transmissive electrodes.

In such case, one of the two transmissive-reflective modules 316 is disposed on a side, close to the substrate 311, of the first electrodes 3121 of the light emitting elements 312, and the other of the two transmissive-reflective modules 316 is disposed on a side, away from the substrate 311, of the second electrodes 3123 of the light emitting elements 312. When the two transmissive-reflective modules 316 are both in the transmissive state, the display panel 3 can realize transparent displaying; when one of the two transmissive-reflective modules 316 is in the transmissive state and the other of the two transmissive-reflective modules 316 is in the reflective state, the display panel 3 displays on one side thereof, and has a relatively good display effect. The two transmissive-reflective modules 316 each are switched between the transmissive state and the reflective state, so that the display panel 3 can be switched between the transparent display mode and the single-sided (any-sided) display mode. That is to say, the user can control the display panel 3 to perform transparent displaying or single-sided (any-sided) displaying according to individual demands, has a relatively high degree of freedom for controlling, and user's experiences are improved.

Figure 7B:
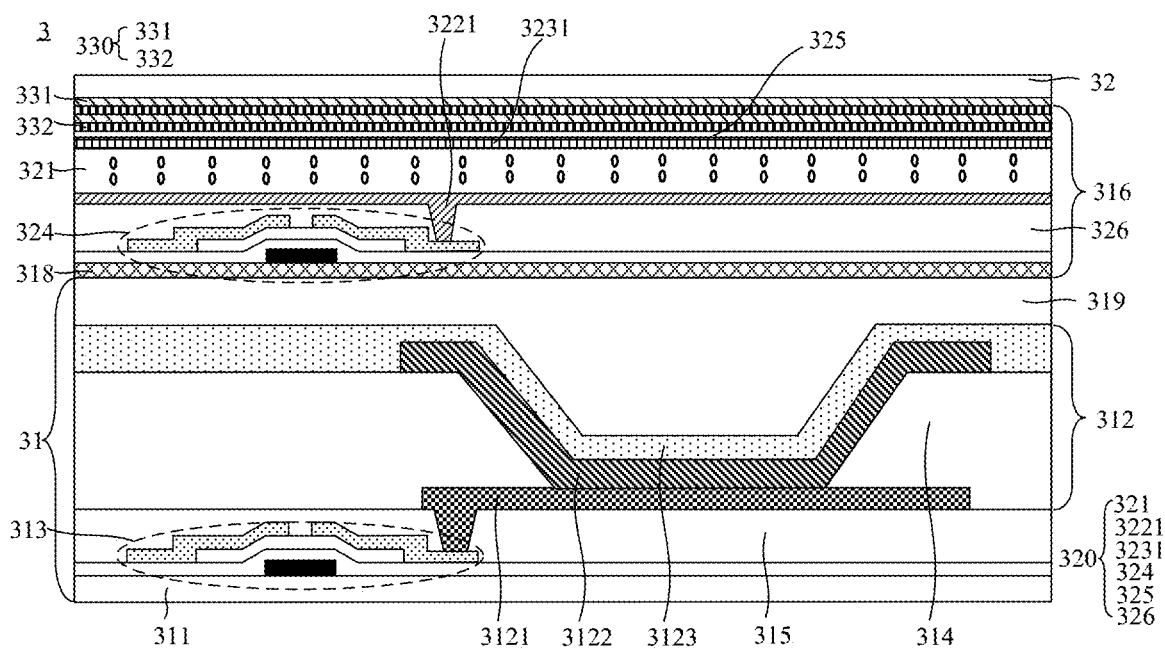
FIG. 7B is a partial cross-sectional view of the display panel shown in FIG. 2 taken along line II'.

In some implementations, as shown in FIGS. 7A and 7B, the first electrodes 3121 of the light emitting elements 312 in the display panel 3 are all reflective electrodes, and the second electrodes 3123 of the light emitting elements 312 in the display panel 3 are all transmissive electrodes.

Figure 9:
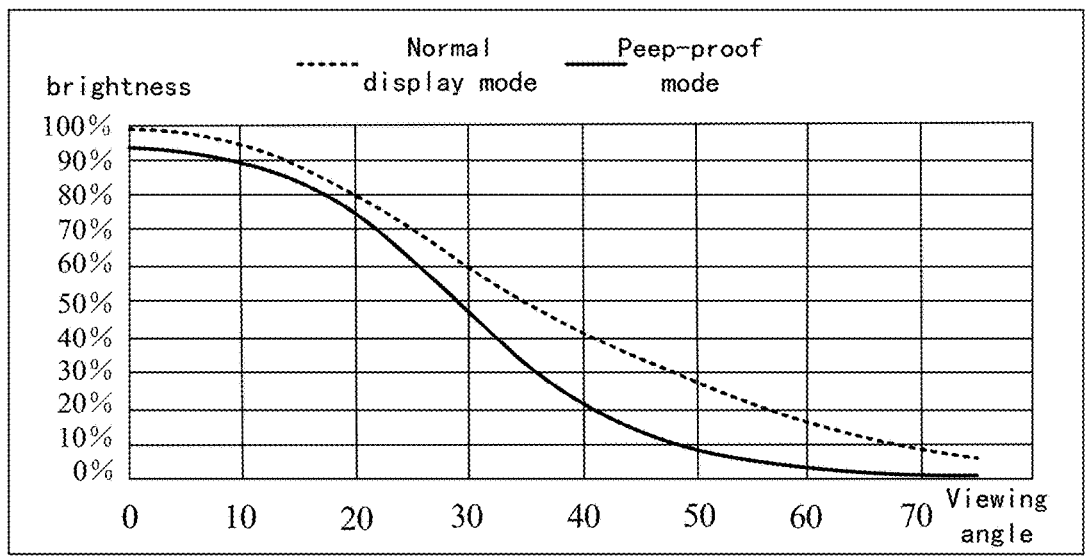
FIG. 9 is a schematic diagram of luminance of viewing angles of a display panel according to an embodiment of the present disclosure.

In such case, the transmissive-reflective module 316 is disposed on a side, away from the substrate 311, of the second electrodes 3123 of the light emitting elements 312. When the transmissive-reflective module 316 is in the transmissive state, the display panel 3 has a relatively large angle for light emitting, and the display panel 3 displays normally; when the transmissive-reflective module 316 is in the reflective state, an enhanced microcavity effect is caused, a brightness of front surface of the display panel 3 is less affected, and the brightness of the display panel 3 is rapidly decreased with an increase of viewing angle (as shown in FIG. 9), so that a side peep-proof effect can be achieved. That is to say, the display panel 3 can be freely switched between a normal display mode and a peep-proof mode, so that user's experiences are improved.

Here, when the transmissive-reflective module 316 is in the reflective state, the reflectance of the transmissive-reflective module 316 is less than that of the first electrode 3121, and the transmittance of the transmissive-reflective module 316 is greater than that of the first electrode 3121, so that the transmissive-reflective module 316 being in the reflective state still serves as a light emitting side of the display panel 3.

It is to be understood that above structure of the transmissive-reflective module 316 is not exclusive. Illustratively, as shown in FIGS. 3A to 8B, the transmissive-reflective module 316 includes a polarizer 318, a liquid crystal cell 320, and a distributed Bragg reflective film layer 330. The liquid crystal cell 320 is disposed on a side, away from the light emitting element 312, of the polarizer 318, and is configured to make a polarization direction of polarized light passing through the liquid crystal cell 320 unchanged or deflected by 90 degrees; the distributed Bragg reflective film layer 330 is disposed on a side, away from the light emitting element 312, of the liquid crystal cell 320, and the distributed Bragg reflective film layer 330 has a relatively high reflection characteristic on light with a polarization direction perpendicular to an absorption axis of the polarizer 318; the distributed Bragg reflective film layer 330 has a relatively high transmittance characteristic on light with a polarization direction parallel to the absorption axis of the polarizer 318.

Figure 10:
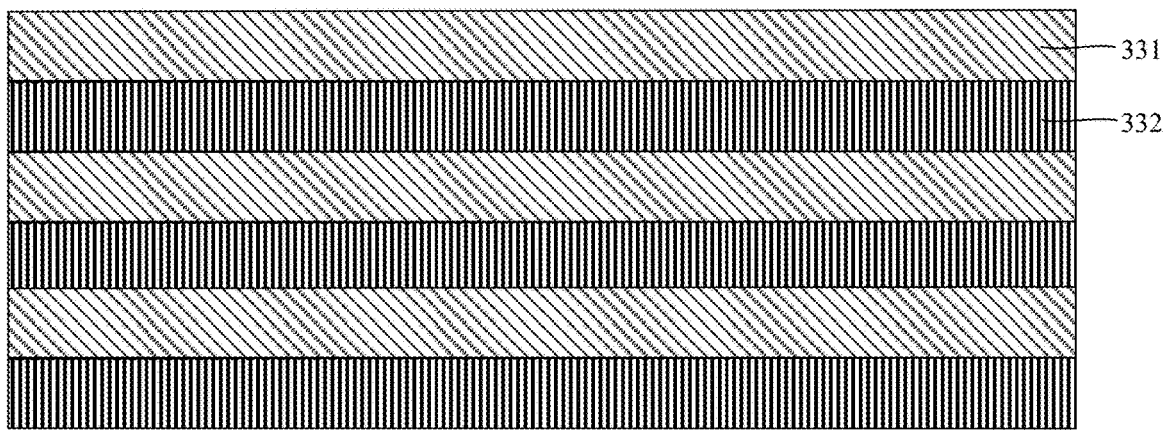
FIG. 10 is a block diagram of a distributed Bragg reflective film layer according to an embodiment of the present disclosure.

With reference to FIG. 10, the distributed Bragg reflective film layer 330 includes a plurality of first dielectric layers 331 and a plurality of second dielectric layers 332; the first dielectric layers 331 and the second dielectric layers 332 are alternately stacked, and for polarized light with a polarization direction perpendicular to the absorption axis of the polarizer 318, a difference between a refractive index of each of the first dielectric layers 331 and a refractive index of each of the second dielectric layers 332 is greater than or equal to about 0.3; and for polarized light with a polarization direction parallel to the absorption axis of the polarizer 318, the difference between the refractive index of each of the first dielectric layers 331 and the refractive index of each of the second dielectric layers 332 is less than or equal to about 0.2.

For example, as shown in FIGS. 2 and 10, the distributed Bragg reflective film layer 330 includes three first dielectric layers 331 and three second dielectric layers 332. For polarized light with a polarization direction perpendicular to the absorption axis of the polarizer 318, i.e., polarized light with a polarization direction in an X direction, the refractive index of each of the first dielectric layers 331 in the X direction is about 2, and the refractive index of each of the second dielectric layers 332 in the X direction is about 1.5. For polarized light with a polarization direction parallel to the absorption axis of the polarizer 318, i.e., polarized light with a polarization direction in a Y direction, the refractive index of each of the first dielectric layers 331 in the Y direction and the refractive index of each of the second dielectric layers 332 in the Y direction each are about 1.5.

The X direction is a direction substantially parallel to a surface, close to the substrate 311, of the polarizer 318, and substantially perpendicular to the absorption axis of the polarizer 318; the Y direction is a direction substantially parallel to the surface, close to the substrate 311, of the polarizer 318, and substantially parallel to the absorption axis of the polarizer 318.

Illustratively, the display panel 3 is approximately of a rectangular shape in a plan view, and the absorption axis of the polarizer 318 is approximately parallel to a long side of the display panel 3. In such case, the X direction refers to a direction substantially parallel to the surface of the display panel 3 and substantially perpendicular to the long side of the display panel 3; the Y direction refers to a direction substantially parallel to the surface of the display panel 3 and substantially parallel to the long side of the display panel 3.

Figure 11:
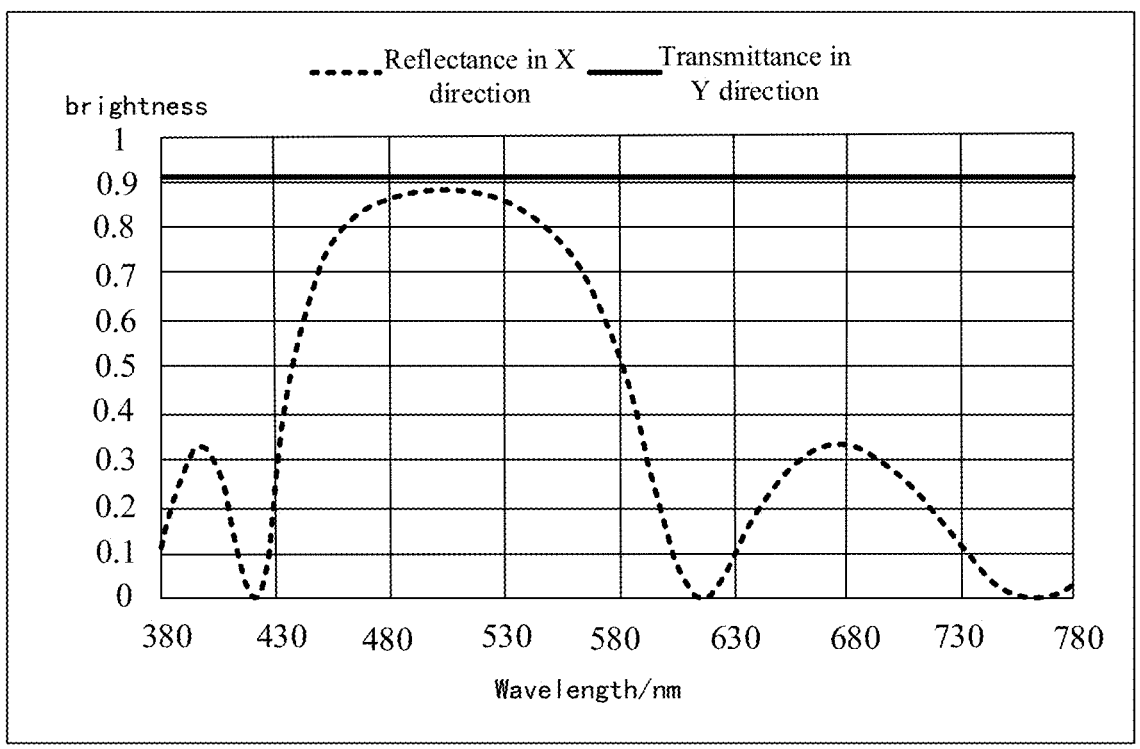
FIG. 11 is a graph of simulation results of reflectance and transmittance of a distributed Bragg reflective film layer according to an embodiment of the present disclosure.

In such case, in a case where light has a wavelength of about 500 nm and each of film thicknesses of the first dielectric layer 331 and the second dielectric layer 332 is ¼ of the wavelength, as can be seen from FIG. 11, at the wavelength of about 500 nm, the reflectance of the distributed Bragg reflective film layer 330 in the X direction can reach about 88%, and the transmittance of the distributed Bragg reflective film layer 330 in the Y direction can reach about 90% or more. Certainly, the actual structure can be optimized according to requirements of product.

As shown in FIGS. 3A to 8B, the liquid crystal cell 320 includes a liquid crystal layer 321, and a third electrode layer 322 and a fourth electrode layer 323 disposed on opposite sides of the liquid crystal layer 321. A direction in which long axes of liquid crystal molecules in the liquid crystal layer 321 extend is perpendicular to a surface of the third electrode layer 322; when no electric field is generated between the third electrode layer 322 and the fourth electrode layer 323, the polarization direction of polarized light does not change when the polarized light passes through the liquid crystal layer 321; when an electric field is generated between the third electrode layer 322 and the fourth electrode layer 323, the liquid crystal molecules in the liquid crystal layer 321 are deflected, and when the polarized light passes through the liquid crystal layer 321, the polarization direction of the polarized light is deflected by 90 degrees.

Figure 4A:
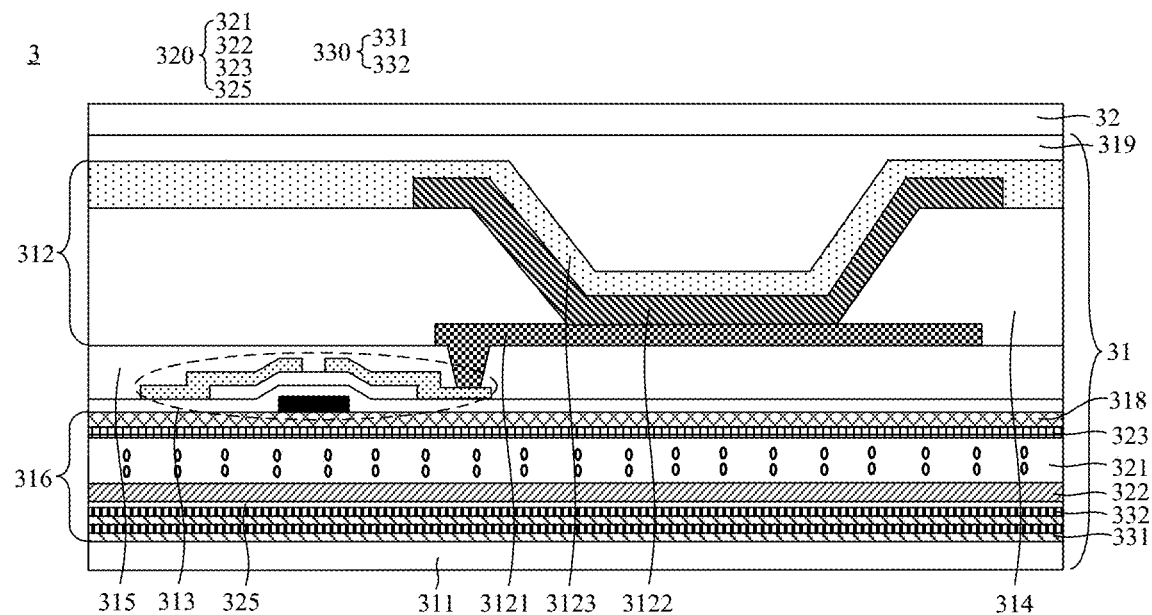
FIG. 4A is a partial cross-sectional view of the display panel shown in FIG. 2 taken along line II'.
Figure 4B:
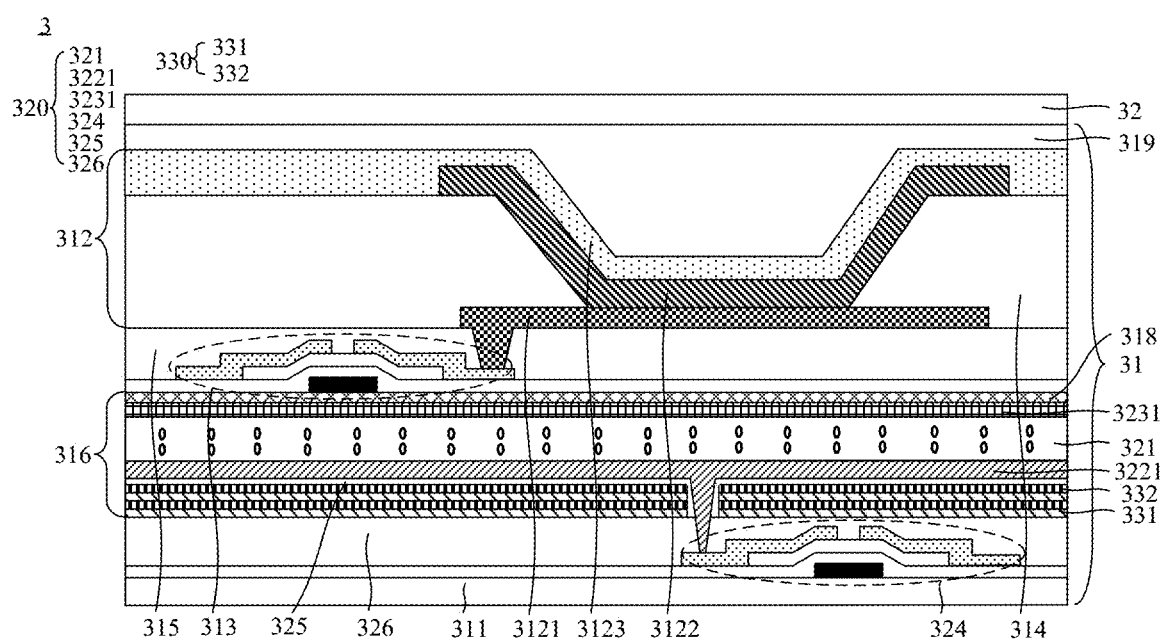
FIG. 4B is a partial cross-sectional view of the display panel shown in FIG. 2 along line II'.

In a case where the transmissive-reflective module 316 is disposed on a side, close to the substrate 311, of the first electrode 3121 of at least one of the light emitting elements 312, the display panel 3 may further include a pixel driving circuit configured to control the light emitting element 312 to emit light; as shown in FIGS. 3A and 3B, the pixel driving circuit may be disposed between the transmissive-reflective module 316 and the substrate 311; alternatively, as shown in FIGS. 4A and 4B, the pixel driving circuit may be disposed between the transmissive-reflective module 316 and the light emitting element 312. The structure and function of the pixel driving circuit may refer to above, and will not be described herein again. In addition, the first planarization layer 315 may be disposed between the thin film transistors 313 of the pixel driving circuit and the transmissive-reflective module 316 accordingly, and the first planarization layer 315 may have a function for insulating in addition to a function for planarization.

In a case where the transmissive-reflective module 316 is disposed on a side, away from the substrate 31, of the second electrode 3123 of at least one of the light emitting elements 312, the display panel 3 may further include an encapsulation layer 32, as shown in FIGS. 6A and 6B, the encapsulation layer 32 may be disposed between the second electrode 3123 of the light emitting element 312 and the transmissive-reflective module 316; alternatively, as shown in FIGS. 7A and 7B, the encapsulation layer 32 may be disposed on a side, away from the substrate 311, of the transmissive-reflective module 316. The structure and function of the encapsulation layer 32 may refer to above, and will not be described herein again.

Figure 8A:
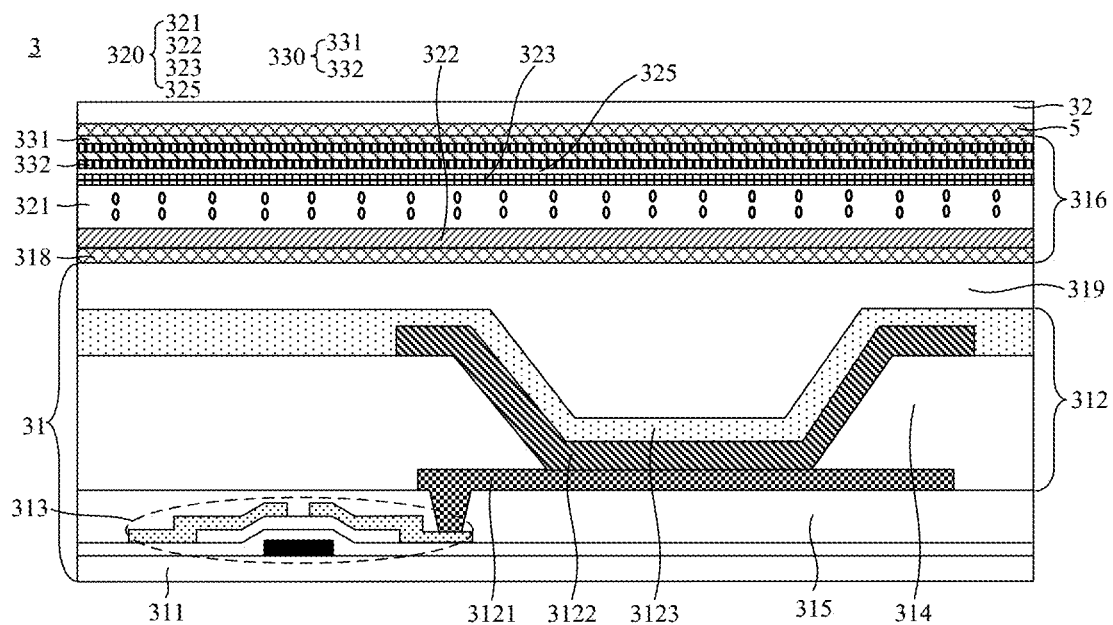
FIG. 8A is a partial cross-sectional view of the display panel shown in FIG. 2 taken along line II'.
Figure 8B:
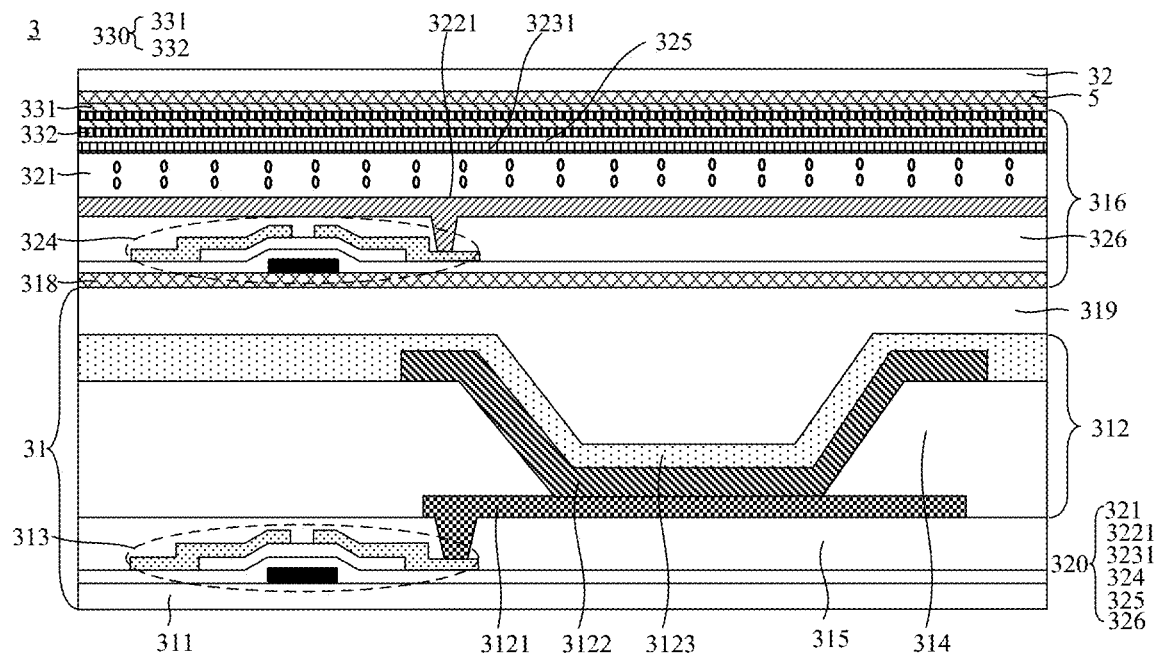
FIG. 8B is a partial cross-sectional view of the display panel shown in FIG. 2 taken along line II'.

In a case that the transmissive-reflective module 316 is disposed on a side, away from the substrate 311, of the second electrode 3123 of at least one of the light emitting elements 312, referring to FIGS. 8A and 8B, the display panel 3 may further include a circular polarizer 5, and the circular polarizer 5 may be disposed on a side, away from the substrate 311, of the transmissive-reflective module 316.

The structure and function of the circular polarizer 5 may refer to above, and will not described herein again.

It should be understood that multiple layers included in the transmissive-reflective module 316 of the display panel 3 may be directly formed on the same substrate 311 as other layers of the display panel 3 through a continuous process, so that the thickness of the display panel 3 is relatively small, which is beneficial to realizing lightness and thinness of the display panel 3.

For example, referring to FIG. 3A, when the transmissive-reflective module 316 is disposed on a side, close to the substrate 311, of the light emitting element 312, the pixel driving circuit, the first planarization layer 315, the distributed Bragg reflective film layer 330, an interlayer insulating layer 325, the third electrode layer 322, the liquid crystal layer 321, the fourth electrode layer 323, the polarizer 318, a first electrode layer, the pixel defining layer 314, the light emitting functional layer 3122, a second electrode layer, a second planarization layer 319, and the encapsulation layer 32 are sequentially formed on the substrate 311 along a direction perpendicular to the substrate 311 and away from the substrate 311. The first electrode layer includes a plurality of patterned first electrodes 3121, and the second electrode layer includes a plurality of patterned second electrodes 3123.

For example, referring to FIG. 4A, when the transmissive-reflective module 316 is disposed on a side, close to the substrate 311, of the light emitting element 312, the distributed Bragg reflective film layer 330, the interlayer insulating layer 325, the third electrode layer 322, the liquid crystal layer 321, the fourth electrode layer 323, the polarizer 318, the pixel driving circuit, the first planarization layer 315, the first electrode layer, the pixel defining layer 314, the light emitting functional layer 3122, the second electrode layer, the second planarization layer 319, and the encapsulation layer 32 are sequentially formed on the substrate 311 along a direction perpendicular to the substrate 311 and away from the substrate 311. The first electrode layer includes a plurality of patterned first electrodes 3121, and the second electrode layer includes a plurality of patterned second electrodes 3123.

For example, referring to FIG. 7A, when the transmissive-reflective module 316 is disposed on a side, away from the substrate 311, of the light emitting element 312, the pixel driving circuit, the first planarization layer 315, the first electrode layer, the pixel defining layer 314, the light emitting functional layer 3122, the second electrode layer, the second planarization layer 319, the polarizer 318, the third electrode layer 322, the liquid crystal layer 321, the fourth electrode layer 323, the interlayer insulating layer 325, the distributed Bragg reflective film layer 330, and the encapsulation layer 32 are sequentially formed on the substrate 311 along a direction perpendicular to the substrate 311 and away from the substrate 311. The first electrode layer includes a plurality of patterned first electrodes 3121, and the second electrode layer includes a plurality of patterned second electrodes 3123.

In some implementations, referring to FIG. 3A, FIG. 4A, FIG. 5A, FIG. 6A, FIG. 7A, and FIG. 8A, the third electrode layer 322 and the fourth electrode layer 323 are full-surface electrode layers, that is, the third electrode layer 322 and the fourth electrode layer 323 are both continuous conductive layers, and each entire surfaces of the third electrode layer 322 and the fourth electrode layer 323 covers the substrate 311.

In such case, in order to generate an electric field between the third electrode layer 322 and the fourth electrode layer 323 to control the liquid crystal molecules therebetween to be deflected at a preset angle, the third electrode layer 322 and the fourth electrode layer 323 are connected to two voltage terminals, respectively, and whether the electric field is generated between the third electrode layer 322 and the fourth electrode layer 323 is controlled by controlling the two voltage terminals being powered on or off.

In some implementations, referring to FIG. 3B, FIG. 4B, FIG. 5B, FIG. 6B, FIG. 7B and FIG. 8B, the third electrode layer 322 includes a plurality of patterned third electrodes 3221, the fourth electrode layer 323 includes a plurality of patterned fourth electrodes 3231, each light emitting element 312 corresponds to one of the third electrodes 3221 and one of the fourth electrodes 3231, that is, each third electrode 3221 and each fourth electrode 3231 are disposed in an opening area of the pixel defining layer 314, respectively.

In such case, in order to generate an electric field between each of the third electrodes 3221 and the fourth electrode 3231 corresponding thereto to control liquid crystal molecules at the corresponding light emitting element 312 to deflect at a preset angle, the liquid crystal cell 320 further includes a liquid crystal driving circuit including at least one driving transistor 324. The driving transistor 324 includes an active layer, a source electrode, a drain electrode, a gate electrode, and a gate insulating layer, the source electrode and the drain electrode being in contact with the active layer, respectively. The source electrode or the drain electrode of the driving transistor 324 is electrically connected to the third electrode 3221 or the fourth electrode 3231, and a third planarization layer 326 is disposed between the driving transistor 324 and the distributed Bragg reflective film layer 330.

It should be noted that, in a case where the transmissive-reflective module 316 is only disposed in the functional element arrangement area 12, after the transmissive-reflective module 316 is fabricated, a planarization layer further needs to be added to balance a height difference of film layers between the main display area 13 and the functional element arrangement area 12, and then other film layer structures may be sequentially fabricated.

It should be understood that, in a process for manufacturing the display panel 3, in order to avoid the electrode (for example, the first electrode 3121 and/or the fourth electrode 3231) contacting the liquid crystal layer 321 when passing through the liquid crystal layer 321 through the via hole, the via hole needs to be reserved in the liquid crystal layer 321. In some implementations, the via hole may be reserved by disposing a retaining wall during a fabrication of the liquid crystal layer 321.

In addition, in order to avoid a short circuit between the first electrode 3121 and the third electrode layer 322 and between the first electrode 3121 and the fourth electrode layer 323 when the first electrode 3121 passes through the third electrode layer 322 and the fourth electrode layer 323 through via holes, in some implementations, sidewalls of the via holes reserved in the third electrode layer 322 and the fourth electrode layer 323 are provided with an insulating film thereon.

As shown in FIG. 1, an embodiment of the present disclosure further provides a display device 100 including the display panel 3 of the embodiment described above.

Compared with the related art, beneficial effects of the display device 100 provided by the present disclosure are the same as those of the display panel 3 provided by the present disclosure, and are not repeated herein.

Figure 12:
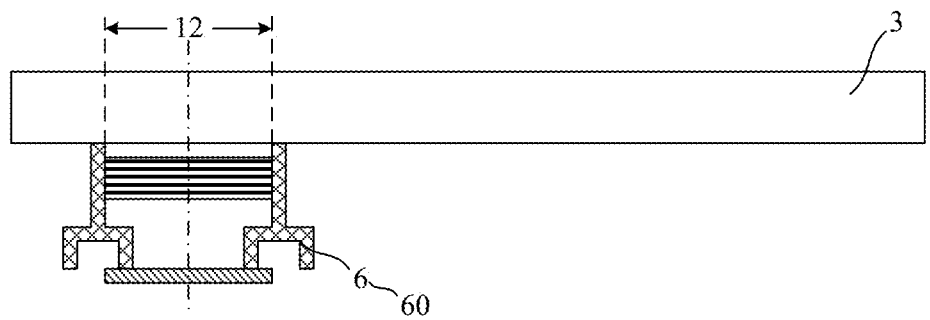
FIG. 12 is a structural diagram of a display device according to an embodiment of the present disclosure.

In some implementations, as shown in FIGS. 2 and 12, the display panel 3 has a functional element arrangement area 12 and a main display area 13 surrounding the functional element arrangement area 12. The light emitting elements 312 of the display panel 3 include a first light emitting element disposed in the functional element arrangement area 12 and a second light emitting element disposed in the main display area 13. The first electrode 3121 and the second electrode 3123 of the first light emitting element are transmissive electrodes; the first electrode 3121 of the second light emitting element is a reflective electrode, and the second electrode 3123 of the second light emitting element is a transmissive electrode. The transmissive-reflective module 316 of the display panel 3 is disposed in the functional element arrangement area 12 and located on a side, close to the substrate 311, of the first electrode 3121 of the first light emitting element.

In such case, the display device 100 may further include a functional element 60 disposed in the functional element arrangement area 12 and disposed on a non-display side of the display panel 3. When the display panel 3 normally displays a picture, the transmissive-reflective module 316 in the functional element arrangement area 12 is configured to be in the reflective state, and light emitted from the light emitting functional layer 3122 can be reflected by the transmissive-reflective module 316 and can transmit through the second electrode 3123, so as to ensure integrity and uniformity of the picture displayed and achieve a relatively good display effect. When the functional element 60 operates, the transmissive-reflective module 316 in the functional element arrangement area 12 is configured to be in the transmissive state, and external light can transmit through the transmissive-reflective module 316; that is, external light can transmit through the functional element arrangement area 12 of the display panel 3, and be received and processed by the functional element 60, thereby ensuring normal operation of the functional element 60.

Here, the functional element 60 may be at least one of a camera 6, an infrared sensor, a proximity sensor, an eyeball tracking module, or a face recognition module. Illustratively, the functional element 60 is the camera 6.

In some implementations, referring to FIGS. 3A and 3B, the first electrodes 3121 and the second electrodes 3123 of the light emitting elements 312 of the display panel 3 are all transmissive electrodes, and the transmissive-reflective module 316 of the display panel 3 is disposed on a side, close to the substrate 311, of the first electrodes 3121 of the light emitting elements 312.

Figure 13:
FIG. 13 is a basic structural diagram of a display device according to an embodiment of the present disclosure.

In such case, referring to FIGS. 3A, 3B, and 13, the display device 100 further includes a reflective mirror 7 disposed on a non-display side of the display panel 3, and a mirror surface of the reflective mirror 7 faces the display panel 3. When the display panel 3 normally displays a picture, the transmissive-reflective module 316 is configured to be in the reflective state, and light emitted from the light emitting functional layer 3122 can be reflected by the transmissive-reflective module 316 and transmit through the second electrode 3123, so as to ensure a relatively strong microcavity effect and a relatively good display effect. When the display panel 3 is in a mirror display mode (not used for displaying a picture), the transmissive-reflective module 316 is configured to be in the transmissive state, so that external light can transmit through the display panel 3 and be reflected by the reflective mirror 7 to present a mirror image, and thereby providing a relatively good mirror display effect.

In some implementations, referring to FIGS. 2, 3A, and 3B, the first electrodes 3121 and the second electrodes 3123 of the light emitting elements 312 in the display panel 3 of the display device 100 are all transmissive electrodes. The transmissive-reflective module 316 is disposed on a side, close to the substrate 311, of the first electrodes 3121 of the light emitting elements 312. When the transmissive-reflective module 316 is in the transmissive state, the display panel 3 can implement transparent displaying; when the transmissive-reflective module 316 is in the reflective state, the display panel 3 displays on a single side thereof, and has a relatively good display effect. That is, the transmissive-reflective module 316 is switched between the transmissive state and the reflective state, so that the display device 100 can be switched between the transparent display mode and the single-sided display mode.

When the display device 100 displays transparently, the user can see not only a virtual picture displayed by the display device 100 but also a real environment behind the display device 100, so that the real environment and the virtual picture can be simultaneously presented in a same picture in real time, and mutual supplement and superposition of real world information and virtual world information can be realized, thereby enabling the user to have an immersive sense of immersion. When the display device 100 displays on one side thereof, the user can only see the virtual picture displayed by the display device 100, and the virtual picture is not interfered by the real environment behind the display device 100, so that a relatively good display effect is achieved.

In such case, the user can control the display device 100 to switch between transparent displaying and single-sided displaying according to requirements, so that user's experiences are improved.

In some implementations, as shown in FIGS. 2, 6A and 6B, the display panel 3 of the display device 100 includes two transmissive-reflective modules 316, and the first electrodes 3121 and the second electrodes 3123 of the light emitting elements 312 in the display panel 3 are all transmissive electrodes. One of the two transmissive-reflective modules 316 is disposed on a side, close to the substrate 311, of the first electrodes 3121 of the light emitting elements 312, and the other of the two transmissive-reflective modules 316 is disposed on a side, away from the substrate 311, of the second electrodes 3123 of the light emitting elements 312. When the two transmissive-reflective modules 316 each are in the transmissive state, the display panel 3 can realize transparent displaying; when one of the two transmissive-reflective modules 316 is in the transmissive state and the other of the two transmissive-reflective modules 316 is in the reflective state, the display panel 3 displays on one side thereof, and a relatively good display effect is achieved. That is, the two transmissive-reflective modules 316 are switched between the transmissive state and the reflective state, so that the display panel 3 can be switched between transparent displaying and single-sided (any-sided) displaying.

Similarly, when the display device 100 displays transparently, the user can see not only the virtual picture displayed by the display device 100 but also the real environment behind the display device 100, so that the real environment and the virtual picture can be simultaneously presented in a same picture in real time, and mutual supplement and superposition of real world information and virtual world information can be realized, thereby enabling the user to have an immersive sense. When the display device 100 displays on one side thereof, the user can only see the virtual picture displayed by the display device 100, and the virtual picture is not interfered by the real environment behind the display device 100, so that a relatively good display effect is achieved.

In such case, the user can control the display device 100 to switch between transparent displaying and single-sided (any-sided) displaying according to needs, thereby improving user's experiences.

In some implementations, as shown in FIGS. 2, 7A, and 7B, the first electrodes 3121 of the light emitting elements 312 in the display panel 3 of the display device 100 are all reflective electrodes, and the second electrodes 3123 of the light emitting elements 312 in the display panel 3 of the display device 100 are all transmissive electrodes. The transmissive-reflective module 316 is disposed on a side, away from the substrate 311, of the second electrodes 3123 of the light emitting elements 312. When the transmissive-reflective module 316 is in the transmissive state, the display panel 3 has a relatively large angle for light emitting, and the display panel 3 displays normally; when the transmissive-reflective module 316 is in the reflective state, an enhanced microcavity effect is caused, a brightness of front surface of the display panel 3 is less affected, and the brightness of the display panel 3 is rapidly decreased with an increase of viewing angle (as shown in FIG. 9), so that a side peep-proof effect can be achieved.

Here, when the transmissive-reflective module 316 is in the reflective state, the reflectance of the transmissive-reflective module 316 is less than that of the first electrode 3121, and the transmittance of the transmissive-reflective module 316 is greater than that of the first electrode 3121, so that the transmissive-reflective module 316 being in the reflective state still serves as a light emitting side of the display panel 3.

The display device 100 has two modes, one mode is a normal display mode, that is, the transmissive-reflective module 316 of the display panel 3 is in the transmissive state, and the display panel 3 has a relatively large angle for light emitting, so that a picture can be displayed clearly in a relatively large range of viewing angles; the other mode is a privacy (peep-proof) mode, that is, the transmissive-reflective module 316 of the display panel 3 is in the reflective state, the display panel 3 has a relatively small angle for light emitting, a picture can be displayed clearly only in a relatively small range of viewing angles, and a relatively high privacy is achieved.

In such case, the user can control the display device 100 to freely switch between the normal display mode and the peep-proof mode according to requirements, so that user's experiences are improved.

The above description is only for exemplary embodiments of the present disclosure, but the scope of the present disclosure is not limited thereto, and any changes or substitutions that may be suggested by those skilled in the art and are within the technical scope of the present disclosure should be covered by the scope of the present disclosure. Therefore, the protection scope of the present disclosure shall be subject to the protection scope of the claims.

The invention claimed is:

1. A display panel, comprising:
   a substrate;
   a plurality of light emitting elements disposed on the substrate; each of the light emitting elements comprises a first electrode, a light emitting functional layer and a second electrode arranged along a direction perpendicular to the substrate and away from the substrate; and
   at least one transmissive-reflective module arranged on a side, close to the substrate, of the first electrode of at least one of the light emitting elements, and/or on a side, away from the substrate, of the second electrode of at least one of the light emitting elements; the transmissive-reflective module is configured to switch between a transmissive state and a reflective state,
   wherein the transmissive-reflective module comprises:
   a polarizer;
   a liquid crystal cell arranged on a side, away from the light emitting elements, of the polarizer, and configured to enable a polarization direction of polarized light passing through the liquid crystal cell to be unchanged or deflected by 90 degrees;
   a distributed Bragg reflective film layer arranged on a side, away from the light emitting elements, of the liquid crystal cell, and the distributed Bragg reflective film layer has a relatively high reflection characteristic on light with a polarization direction perpendicular to an absorption axis of the polarizer; the distributed Bragg reflective film layer has a relatively high transmission characteristic on light with a polarization direction parallel to the absorption axis of the polarizer.

2. The display panel according to claim 1, wherein the display panel has a functional element arrangement area, and a main display area surrounding the functional element arrangement area; the light emitting elements comprise a first light emitting element arranged in the functional element arrangement area and a second light emitting element arranged in the main display area;
   wherein the first electrode and the second electrode of the first light emitting element are transmissive electrodes; the first electrode of the second light emitting element is a reflective electrode, and the second electrode of the second light emitting element is a transmissive electrode;
   the transmissive-reflective module is arranged in the functional element arrangement area and is positioned on a side, close to the substrate, of the first electrode of the first light emitting element.

3. The display panel of claim 2, wherein the liquid crystal cell comprises a liquid crystal layer, and a third electrode and a fourth electrode layer disposed on opposite sides of the liquid crystal layer; a long axis direction of liquid crystal molecules in the liquid crystal layer is approximately vertical to a surface of the third electrode layer;
   the liquid crystal cell is configured such that a polarization direction of polarized light passing through the liquid crystal layer is not changed when no electric field is generated between the third electrode layer and the fourth electrode layer; and when an electric field is generated between the third electrode layer and the fourth electrode layer, liquid crystal molecules in the liquid crystal layer are deflected, and the polarization direction of polarized light passing through the liquid crystal layer is deflected by 90 degrees.

4. The display panel according to claim 1, wherein first electrodes and second electrodes of the light emitting elements are all transmissive electrodes;
   the transmissive-reflective module is disposed on a side, close to the substrate, of the first electrodes of the light emitting elements.

5. The display panel according to claim 4, further comprising a specular reflection layer arranged on a side, close to the substrate, of the transmissive-reflective module.

6. The display panel according to claim 1, wherein first electrodes and second electrodes of the light emitting elements are all transmissive electrodes;
the display panel comprises two transmissive-reflective modules, one of the two transmissive-reflective modules is arranged on a side, close to the substrate, of the first electrodes of the light emitting elements, and the other of the two transmissive-reflective modules is arranged on a side, away from the substrate, of the second electrodes of the light emitting elements.

7. The display panel according to claim 1, wherein first electrodes of the light emitting elements are all reflective electrodes, and second electrodes of the light emitting elements are all transmissive electrodes;
the transmissive-reflective module is arranged on a side, away from the substrate, of the second electrodes of the light emitting elements.

8. The display panel according to claim 1, wherein the distributed Bragg reflective film layer comprises a plurality of first dielectric layers and a plurality of second dielectric layers, and the first dielectric layers and the second dielectric layers are alternately stacked;
for polarized light with the polarization direction perpendicular to the absorption axis of the polarizer, a difference between a refractive index of each of the first dielectric layers and a refractive index of each of the second dielectric layers is greater than or equal to about 0.3; for polarized light with the polarization direction parallel to the absorption axis of the polarizer, the difference between the refractive index of each of the first dielectric layers and the refractive index of each of the second dielectric layers is less than or equal to about 0.2.

9. The display panel according to claim 1, wherein the liquid crystal cell comprises a liquid crystal layer, and a third electrode layer and a fourth electrode layer disposed on opposite sides of the liquid crystal layer; a long axis direction of liquid crystal molecules in the liquid crystal layer is approximately vertical to a surface of the third electrode layer;
the liquid crystal cell is configured such that a polarization direction of polarized light passing through the liquid crystal layer is not changed when no electric field is generated between the third electrode layer and the fourth electrode layer; and when an electric field is generated between the third electrode layer and the fourth electrode layer, liquid crystal molecules in the liquid crystal layer are deflected, and the polarization direction of polarized light passing through the liquid crystal layer is deflected by 90 degrees.

10. The display panel according to claim 1, wherein the transmissive-reflective module is disposed on a side, close to the substrate, of the first electrode of at least one of the light emitting elements;
the display panel further comprises:
a pixel driving circuit arranged between the transmissive-reflective module and the substrate.

11. The display panel according to claim 1, wherein the transmissive-reflective module is disposed on a side, away from the substrate, of the second electrode of at least one of the light emitting elements;
the display panel further comprises:
an encapsulation layer arranged on a side, away from the substrate, of the transmissive-reflective module.

12. The display panel according to claim 1, wherein the transmissive-reflective module is disposed on a side, away from the substrate, of the second electrode of at least one of the light emitting elements;
the display panel further comprises:
a circular polarizer arranged on a side, away from the substrate, of the transmissive-reflective module.

13. A display device, comprising the display panel according to claim 1.

14. The display device according to claim 13, wherein the display panel has a functional element arrangement area, and a main display area surrounding the functional element arrangement area;
the light emitting elements of the display panel comprise a first light emitting element arranged in the functional element arrangement area and a second light emitting element arranged in the main display area; the first electrode and the second electrode of the first light emitting element are transmissive electrodes; the first electrode of the second light emitting element is a reflective electrode, and the second electrode of the second light emitting element is a transmissive electrode;
the transmissive-reflective module of the display panel is arranged in the functional element arrangement area and is positioned on a side, close to the substrate, of the first electrode of the first light emitting element;
the display device further comprises:
a functional element arranged in the functional element arrangement area and arranged on a non-display side of the display panel.

15. The display device according to claim 13, wherein first electrodes and second electrodes of the light emitting elements of the display panel are all transmissive electrodes, and the transmissive-reflective module of the display panel is disposed on a side, close to the substrate, of the first electrodes of the light emitting elements;
the display device further comprises:
a reflective mirror arranged on a non-display side of the display panel, and a mirror surface of the reflective mirror faces the display panel.

* * * * *